United States Patent
Harnik et al.

(10) Patent No.: US 6,362,096 B1
(45) Date of Patent: Mar. 26, 2002

(54) WAFER PROCESSING WITH WATER VAPOR PUMPING

(75) Inventors: Arie Harnik, Haifa; Michael Sandler, Migdal Ha'emek; Itai Bransky, Haifa, all of (IL)

(73) Assignee: Streag CVD Systems LTD, Migdal Ha'emek (IL)

( * ) Notice: Subject to any disclaimer, the term of this patent is extended or adjusted under 35 U.S.C. 154(b) by 0 days.

(21) Appl. No.: 09/610,778

(22) Filed: Jul. 6, 2000

Related U.S. Application Data

(63) Continuation of application No. 09/126,323, filed on Jul. 31, 1998, now abandoned.

(51) Int. Cl.[7] ............................................. C23C 16/24
(52) U.S. Cl. ..................... 438/657; 438/660; 438/665; 438/680; 427/248.1; 427/255.23; 427/255.393; 427/376.2
(58) Field of Search ................. 438/657, 660, 438/665, 680; 427/248.1, 255.23, 255.393, 376.2

(56) References Cited

U.S. PATENT DOCUMENTS

| | | | |
|---|---|---|---|
| 3,811,319 A | 5/1974 | Arnold | 73/23 |
| 5,062,271 A | 11/1991 | Okumura et al. | 62/55.5 |
| 5,863,602 A | 1/1999 | Wantanabe et al. | 427/237 |
| 5,885,869 A | 3/1999 | Turner et al. | 438/261 |
| 5,963,833 A | 10/1999 | Thakur | 438/677 |

OTHER PUBLICATIONS

Watanabe et al., "An Advanced Technique for Fabricating Hemispherical–Grained (HSG) Silicon Storage Electrodes" in IEEE Transactions on Electron Devices, 42 (1995), pp. 295–300.

Sanganeria et al., "Low Temperature Silicon epitaxy in an Ultrahigh Vacuum Rapid Thermal Chemical Vapor Deposition Reactor Using Disilane", applied Physics Letters 63 (1993), pp. 1225–1227.

M. Moslehi, "Low Temperature in Situ Dry Cleaning Process for Epitaxial Layer Multiprocessing", SPIE 1393 Rapid Thermal and Related Processing Techniques (1990), pp. 90–108.

*Primary Examiner*—Timothy Meeks
(74) *Attorney, Agent, or Firm*—Connolly Bove Lodge & Hutz LLP

(57) ABSTRACT

A method and apparatus for selectively depositing hemispherical grained silicon on the surface of a wafer in a process chamber. The chamber is evacuated so that a partial pressure of water vapor in the chamber is less than $10^{-7}$ torr, preferably using a turbomolecular pump and a water vapor pump in cooperation. A process gas mixture including silicon is introduced into the chamber. The surface of the wafer is seeded with silicon nuclei, and the wafer is annealed to convert the silicon to HSG.

12 Claims, 1 Drawing Sheet

WAFER PROCESSING WITH WATER VAPOR PUMPING

CROSS-REFERENCE TO RELATED APPLICATIONS

This application is a continuation of U.S. patent application Ser. No. 09/126,323, filed Jul. 31, 1998 now abandoned. This parent application is incorporated herein by reference in its entirety.

FIELD OF THE INVENTION

The present invention relates generally to methods and apparatus for semiconductor wafer processing, and specifically to methods of processing based on rapid thermal chemical vapor deposition (RTCVD).

BACKGROUND OF THE INVENTION

Hemispherical grained silicon (HSG) has been found to be particularly advantageous in the production of ultralarge-scale integrated (ULSI) semiconductor devices, such as high-density DRAM. There is consequently a growing demand for selective deposition of HSG. Methods for promoting HSG formation are described by Watanabe et al., in "An Advanced Technique for Fabricating Hemispherical-Grained (HSG) Silicon Storage Electrodes," in IEEE Transactions on Electron Devices 42 (1995), pages 295–300; and by Sanganeria et al., in "Low Temperature Silicon Epitaxy in an Ultrahigh Vacuum Rapid Thermal Chemical Vapor Deposition Reactor Using Disilane," in Applied Physics Letters 63 (1993), pages 1225–1227. These articles are incorporated herein by reference.

HSG deposition, like many of the steps in semiconductor wafer processing, is best performed under high vacuum. The presence of even very small concentrations of residual gases in an evacuated process chamber generally has deleterious effects on the selectivity of HSG formation. These constraints pose a particular challenge in high-performance integrated RTCVD processing, in which a number of process modules are typically connected together in a cluster tool configuration. High vacuum must generally be maintained not only in the RTCVD modules themselves, but also in other cluster tool components, such as load locks, transfer chambers and cleaning modules. In order to maximize up-time of the cluster tool, it is also desirable that the system be able to recover the required vacuum pressure rapidly after atmospheric exposure for cleaning or maintenance.

Many different methods and systems have been developed to reduce residual impurities, such as water vapor, in semiconductor process chambers. One such method is described, for example, by Moslehi, in "Low-Temperature In-Situ Dry Cleaning Process for Epitaxial Layer Multiprocessing," in SPIE 1393 Rapid Thermal and Related Processing Techniques (1990), pages 90–108, which is incorporated herein by reference. Similarly, in U.S. Pat. No. 5,062,271, which is incorporated herein by reference, Okumura, et al., describe a method and apparatus for evacuation of a processing chamber using a turbomolecular pump in series with a heat exchanger cooled by a helium refrigerator. The heat exchanger freeze-traps certain gas molecules, particularly water vapor, which normally cannot be efficiently pumped by the turbomolecular pump.

SUMMARY OF THE INVENTION

It is an object of some aspects of the present invention to provide an improved method and apparatus for selective formation of HSG on a semiconductor wafer.

It is a further object of some aspects of the present invention to provide an improved vacuum system and method of pumping for RTCVD processes.

In preferred embodiments of the present invention, vacuum apparatus for a RTCVD process chamber comprises a turbomolecular pump and a water vapor pump, which communicate with the chamber via a vacuum isolation valve. The water vapor pump selectively removes water vapor from the chamber without pumping substantial amounts of process gases, which are pumped by the turbomolecular pump. The apparatus enables the chamber to rapidly reach a high vacuum with a reduced level of residual water vapor relative to the level achievable using a turbomolecular pump alone. Preferably, the base pressure that is achieved is less than $10^{-7}$ torr, more preferably less than $10^{-8}$ torr, and most preferably at or below $10^{-9}$ torr.

In some preferred embodiments of the present invention, the water vapor pump comprises a cryogenic pump, which is preferably connected in series between the isolation valve and the turbomolecular pump. When the cryogenic pump becomes saturated, the isolation valve is preferably closed, and the turbomolecular pump is used to pump off water vapor that is released as the cryogenic pump is allowed to warm up.

In other preferred embodiments of the present invention, the water vapor pump comprises a getter-type pump, which is preferably connected in a sidestream configuration between the isolation valve and the turbomolecular pump. Preferably, the water vapor pump comprises a disposable getter, which is closed off and replaced when it becomes saturated. Alternatively, the getter may be regenerated by pumping it out through the backing pump with the isolation valve closed, as in the case of the cryogenic pump described above.

In some preferred embodiments of the present invention, the RTCVD chamber with reduced residual water vapor is used in a method for selective deposition of HSG. HSG is formed on a wafer surface by nucleation of Si grains on an amorphous silicon (a-Si) substrate and subsequent diffusion of Si atoms into the grain nuclei, resulting in conversion of the a-Si to a HSG structure. The inventors have found that formation of the HSG competes with other processes that take place on the wafer surface, which are dependent on the presence of water molecules. When the partial pressure of residual water vapor in the chamber is sufficiently low, preferably below $10^{-8}$ torr, the HSG is formed with substantial selectivity relative to the competing processes.

There is therefore provided, in accordance with a preferred embodiment of the present invention, a method for selectively depositing hemispherical grained silicon on the surface of a wafer in a process chamber, including:

evacuating the chamber so that a partial pressure of water vapor in the chamber is less than $10^{-7}$ torr;

introducing a process gas mixture including silicon into the chamber;

seeding the surface with silicon grains; and annealing the wafer.

Preferably, evacuating the chamber includes evacuating to a partial pressure of water vapor less than $10^{-8}$ torr, and most preferably less than or equal to $10^{-9}$ torr.

Preferably, evacuating the chamber includes pumping the chamber using a water vapor pump together with a turbomolecular pump. Preferably, the water vapor pump includes a cryogenic pump. Alternatively, the water vapor pump includes a getter, which is preferably replaced after a period of use thereof.

Preferably, the method includes regenerating the water vapor pump after a period of use thereof, most preferably by heating the water vapor pump while pumping with the turbomolecular pump.

Preferably, pumping the chamber includes using the water vapor pump to collect water vapor from the chamber, without collecting a substantial amount of the process gas in the water vapor pump.

In a preferred embodiment, introducing the process gas mixture includes introducing a mixture including at least one of the gases $SiH_4$ and $Si_2H_6$, together with at least one of the gases $N_2$ and $H_2$. Preferably, introducing the mixture includes introducing a mixture at a pressure generally between $10^{-6}$ torr and 1 torr, most preferably generally between $1\times10^{-5}$ and $5\times10^{-5}$ torr.

Preferably, annealing the wafer includes annealing at a temperature between about 600 and 700° C.

There is also provided, in accordance with a preferred embodiment of the present invention, apparatus for selectively depositing hemispherical grained silicon on the surface of a wafer, including:

a process chamber, into which the wafer is introduced, the chamber having an outlet;

a turbomolecular pump having an inlet in communication with the outlet of the chamber, which pump evacuates the chamber through the inlet; and a water vapor pump, in communication with the outlet of the chamber and the inlet of the turbomolecular pump, which water vapor pump removes water vapor from the chamber to a partial pressure less than $10^{-7}$ torr prior to deposition of the silicon.

Preferably, the water vapor pump removes the water vapor to a partial pressure less than $10^{-8}$ torr, and most preferably to a partial pressure less than or equal to $10^{-9}$ torr. Preferably, the water vapor pump removes the water vapor without collecting a substantial amount of process gas from the chamber.

Preferably, the water vapor pump includes a cryogenic pump.

Alternatively, the water vapor pump includes a getter. Preferably, the getter is replaceable, and the apparatus includes a cutoff valve connected between the getter and the inlet of the turbomolecular pump, which valve is closed in order to replace the getter.

Preferably, the apparatus includes an isolation valve connected to the outlet of the chamber, which valve is closed during a regeneration cycle of the water vapor pump. Preferably, the water vapor pump is regenerated by pumping out the water vapor pump using the turbomolecular pump.

Further preferably, the apparatus includes a dry type backing pump which receives an exhaust of the turbomolecular pump.

The present invention will be more fully understood from the following detailed description of the preferred embodiments thereof, taken together with the drawings in which:

DETAILED DESCRIPTION OF PREFERRED EMBODIMENTS

Figure 1:
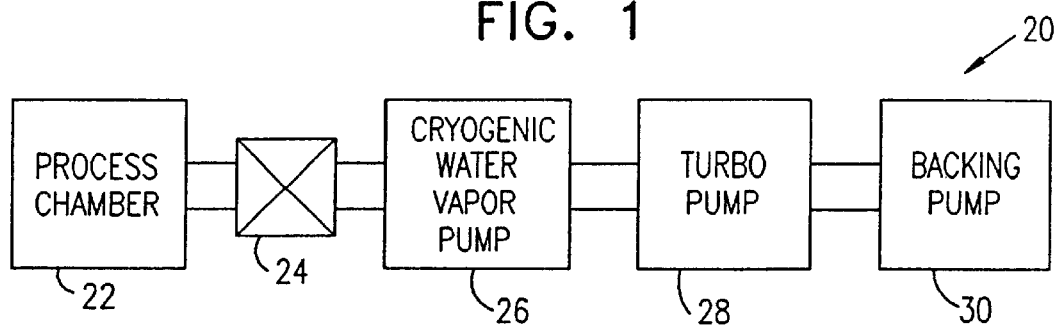
FIG. 1 is a schematic block diagram of RTCVD processing apparatus, in accordance with a preferred embodiment of the present invention.

Reference is now made to FIG. 1, which is a schematic block diagram showing RTCVD processing apparatus 20, in accordance with a preferred embodiment of the present invention. The apparatus is preferably used as part of a cluster tool system, as described hereinabove, although it will be understood that the principles of the present invention are similarly applicable in other wafer processing configurations, as well.

A silicon wafer to be processed is introduced into a process chamber 22, as is known in the art. An outlet of the chamber is connected via a vacuum isolation valve 24, preferably a gate valve, to a vacuum pumping system that includes a water vapor pump 26, a turbomolecular pump 28 and a mechanical backing pump 30. The turbomolecular and backing pumps may be of any suitable type known in the semiconductor processing art, preferably dry type pumps that are compatible with corrosive semiconductor process gases. For example, the turbomolecular pump may comprise an ATP 400 HPC pump, and the backing pump may comprise an ADS 301 pump, both manufactured by Alcatel SA, Annecy, France. The gate valve may comprise a VAT 14044 valve, produced by VAT Vacuumventile AG, Haag, Switzerland. Ordinarily, in RTCVD systems known in the art (unlike apparatus 20), the turbomolecular and backing pumps are used without an additional water vapor pump; but such systems suffer from relatively slow pumping rates because of the poor performance of turbomolecular pumps in pumping water vapor.

Water vapor pump 26 preferably comprises a cryogenic pump, such as an AT 160 pump, produced by APD Cryogenics Inc., Allentown, Pa., which is preferably cooled to a temperature between 120 and 130° K. The temperature of the water vapor pump is preferably set so that it freezes out substantially all of the water vapor from chamber 22, down to a partial pressure of $10^{-8}$ torr or lower, and most preferably at or below $10^{-9}$, but without freezing out the process gases. The process gases, along with other gases in chamber 22, are pumped through the water vapor pump by turbomolecular pump 28 and are exhausted by backing pump 30. Because the water vapor is removed by water vapor pump 26, turbomolecular pump 28 can pump chamber 22 down to an acceptable, substantially dry vacuum level considerably more rapidly than would otherwise be possible.

When it is determined that water vapor pump 26 has become saturated, or alternatively, at regularly scheduled maintenance intervals, the water vapor pump is regenerated. Preferably, valve 24 is closed, and pump 26 is allowed to return to room temperature, so that the trapped water vapor is released and is pumped out by turbomolecular pump 28 through backing pump 30. Optionally, water vapor pump 26 may be heated to mobilize the water vapor more rapidly. Because of the selectivity of pump 26 in adsorbing water molecules without capturing corrosive and flammable process gases, there is little danger of explosion or other damage that could otherwise occur during such a regeneration step.

Figure 2:
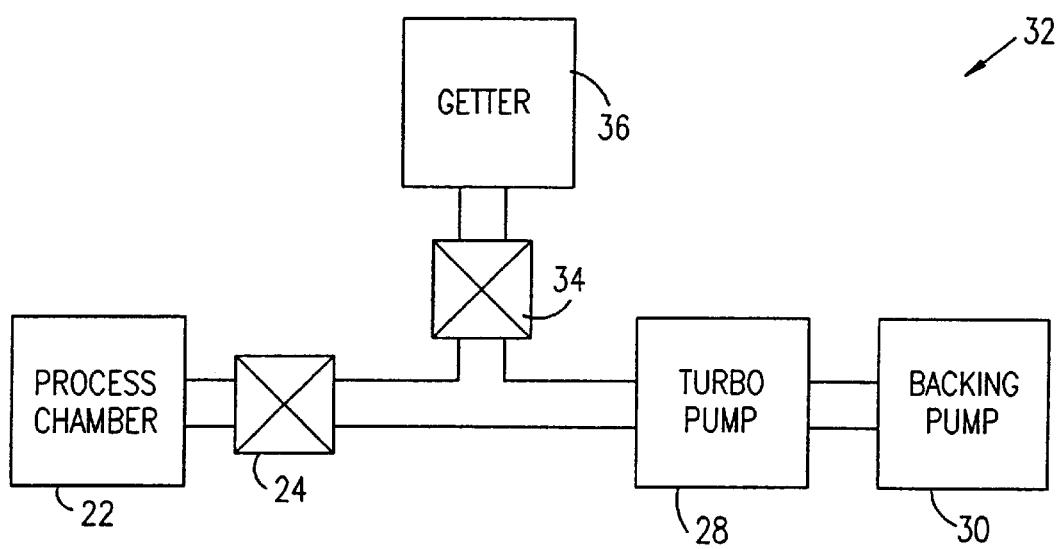
FIG. 2 is a schematic block diagram of RTCVD processing apparatus, in accordance with another preferred embodiment of the present invention.

FIG. 2 is a schematic block diagram showing RTCVD processing apparatus 32, in accordance with another preferred embodiment of the present invention. This embodiment is generally similar to that shown in FIG. 1, except that in apparatus 32 a getter 36 is used as the water vapor pump. Getter 36 preferably comprises a disposable type of water vapor getter, such as an "Capacitorr" getter, produced by SAES Getters SpA, Lainate (Milan), Italy. Getter 36 is preferably connected between isolation valve 24 and turbomolecular pump 28 in a sidestream configuration, as shown in FIG. 2, and is separated from the other elements of apparatus 32 by a cut-off valve 34. When getter 36 needs to be replaced, valve 34 is closed, so that the getter can be removed without opening the entire system to atmospheric air.

Alternatively, getter 36 may comprise a regenerative type getter, which can be connected either in the sidestream configuration of FIG. 2 or in a mainstream configuration as shown in FIG. 1. In this case, the getter is regenerated, in a manner substantially similar to that described above with reference to the cryogenic water vapor pump. Further alternatively, a cryogenic water pump, as described above, may be used in the sidestream configuration of FIG. 2 in place of getter 36, preferably with an additional line (not shown) connecting the water pump to backing pump 30, through which line the water pump is evacuated during regeneration.

Figure 3:
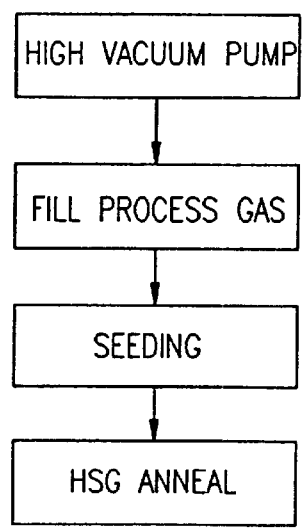
FIG. 3 is a flow chart that schematically illustrates a process for selective HSG formation on a silicon wafer, in accordance with a preferred embodiment of the present invention.

FIG. 3 is a flow chart illustrating a method for selective HSG formation on a silicon wafer, in accordance with a preferred embodiment of the present invention. This method is preferably carried out using RTCVD apparatus 20 or 32, as shown in FIG. 1 or FIG. 2, respectively, and described hereinabove. Alternatively, the method may be implemented using other types of process tools and vacuum systems, as long as an adequate level of vacuum is reached, preferably better than $10^{-8}$ torr, including the partial pressure of water vapor in the system. The inventors have found that in order to convert amorphous Si (a-Si) to HSG, the partial pressure of water vapor must be less than $10^{-7}$ torr; and for achieving selective conversion to HSG, the partial pressure of water vapor must remain below $10^{-8}$ torr. This dependence of HSG formation on water vapor pressure was ascertained experimentally by means of thin film measurements made on wafers after HSG deposition, using methods such as electron microscopy, UV reflectance measurements and I-V probing, as are known in the art.

Accordingly, a wafer with a suitable surface layer of starting material, preferably a-Si, is introduced into chamber 22, which is pumped down until the total pressure and the partial pressure of water vapor are below $10^{-8}$ torr. A suitable gas mixture, preferably comprising $SiH_4$, $Si_2H_6$, $N_2$ and $H_2$, is introduced into the chamber. Preferably, the pressure of the gas mixture in the chamber is in the range of $1-5\times10^{-5}$ torr, although pressures below and above this range may also be used, up to as high as 10 torr. The wafer surface layer is seeded with HSG grains, as described in the above-referenced article by Violette, and is then annealed, preferably at a temperature between 600° C. and 700° C. Under these conditions, it has been found that the Si surface layer is kept substantially free of oxygen and $SiO_2$, so that the deposited Si nucleates selectively in the hemispherical grains (HSG), while undesirable, competing nucleation processes are suppressed.

It will be appreciated that the above gas components, proportions and temperatures are given for purposes of illustration, and that other gas mixtures and process conditions can be used to produce the HSG. The key requirement is that the partial water vapor pressure be kept very low, as described hereinabove. It will be generally understood, moreover, that the preferred embodiments described above are cited by way of example, and the full scope of the invention is limited only by the claims.

What is claimed is:

1. A method for selectively depositing hemispherical grained silicon in a rapid thermal chemical vapor deposition (RTCVD) process chamber using processes gases, the method consisting essentially of:

introducing a single wafer into the RTCVD chamber;

evacuating the chamber using a water vapor pump together with a turbomolecular pump, both pumps located outside the chamber, so that the water vapor pump selectively removes water vapor from the chamber without collecting substantial amounts of the process gases, thus removing water vapor from the chamber to a partial pressure in the chamber of less than $10^{-7}$ torr;

introducing a mixture of the process gases including silicon into the chamber;

seeding the surface of the wafer with silicon nuclei; and annealing the wafer to convert the silicon to HSG.

2. A method according to claim 1, wherein evacuating the chamber comprises evacuating to a partial pressure of water vapor less than $10^{-8}$ torr.

3. A method according to claim 2, wherein evacuating the chamber comprises evacuating to a partial pressure of water vapor less than or equal to $10^{-9}$ torr.

4. A method according to claim 1, wherein the water vapor pump comprises a cryogenic pump.

5. A method according to claim 1, wherein the water vapor pump comprises a getter.

6. A method according to claim 5, and comprising replacing the getter after a period of use thereof.

7. A method according to claim 1, and comprising regenerating the water vapor pump after a period of use thereof.

8. A method according to claim 7, wherein regenerating the water vapor pump comprises heating the water vapor pump while pumping with the turbomolecular pump.

9. A method according to claim 1, wherein introducing the mixture of the process gases comprises introducing a mixture comprising at least one of the gases $SiH_4$ or $Si_2H_6$, together with at least one of the gases $N_2$ or $H_2$.

10. A method according to claim 9, wherein introducing the mixture of the process gases comprises introducing the mixture of the process gases at a pressure generally between $10^{-6}$ torr and 1 torr.

11. A method according to claim 10, wherein introducing the mixture of the process gases comprises introducing the mixture of the process gases at a pressure generally between $1\times10^{-5}$ and $5\times10^{-5}$ torr.

12. A method according to claim 1, wherein annealing the wafer comprises annealing at a temperature between about 600 and 700° C.

* * * * *